(12) United States Patent
Bae et al.

(10) Patent No.: US 10,141,133 B2
(45) Date of Patent: Nov. 27, 2018

(54) ELECTRONIC DEVICE INCLUDING KEY

(71) Applicant: Samsung Electronics Co., Ltd, Gyeonggi-do (KR)

(72) Inventors: Myung-Hyo Bae, Daegu (KR); Young-Tae Kim, Gyeongsangbuk-do (KR); Sang-Hun Park, Busan (KR); Jin-Wan An, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/436,708

(22) Filed: Feb. 17, 2017

(65) Prior Publication Data

US 2017/0243705 A1    Aug. 24, 2017

(30) Foreign Application Priority Data

Feb. 19, 2016 (KR) .................. 10-2016-0019893

(51) Int. Cl.
| | |
|---|---|
| *H01H 13/14* | (2006.01) |
| *G07C 9/00* | (2006.01) |
| *H01H 13/06* | (2006.01) |
| *H05K 1/02* | (2006.01) |
| *H05K 1/18* | (2006.01) |
| *H04M 1/18* | (2006.01) |

(52) U.S. Cl.
CPC ......... *H01H 13/14* (2013.01); *G07C 9/00563* (2013.01); *H01H 13/06* (2013.01); *H05K 1/028* (2013.01); *H05K 1/18* (2013.01); *G07C 2009/00968* (2013.01); *H04M 1/18* (2013.01); *H05K 2201/10053* (2013.01)

(58) Field of Classification Search
CPC ....................................................... H01H 13/14
USPC ........................................................ 361/752
See application file for complete search history.

(56) References Cited

U.S. PATENT DOCUMENTS

| | | | |
|---|---|---|---|
| 9,030,440 B2 | 5/2015 | Pope et al. | |
| 2011/0255260 A1* | 10/2011 | Weber ................... | H04M 1/026 361/807 |
| 2013/0119488 A1* | 5/2013 | Sherlock ............ | G06K 9/00013 257/414 |
| 2013/0307818 A1* | 11/2013 | Pope ....................... | G06F 3/044 345/174 |
| 2014/0311882 A1* | 10/2014 | Terashita ............... | H01H 13/10 200/520 |
| 2015/0071509 A1* | 3/2015 | Myers ................. | G06K 9/0002 382/124 |

(Continued)

*Primary Examiner* — Hoa C Nguyen
*Assistant Examiner* — Stanley Tso

(57) ABSTRACT

Disclosed are various embodiments relating to an electronic device that includes a key An electronic device may include a housing having a through-hole formed therein. A key may be exposed through the through-hole and configured to be pressed. A key switch may be located on a rear surface of the key, wherein the key structure may be configured to enable the key to be pressed and to detect the press of the key. Moreover, a structure provided on a lower portion of the housing may be able to bear a pressure exerted by a user when pressing the key in a direction opposite the housing. Further, a dummy detachably provided between the housing and the structure, wherein the dummy, when being attached, may support the key and the key switch such that both are capable of being pressed in the through-hole toward the direction of the structure.

15 Claims, 16 Drawing Sheets

(56) References Cited

U.S. PATENT DOCUMENTS

2016/0172129 A1* 6/2016 Zercoe ................ H01H 13/023
                                                                  200/5 A
2017/0125190 A1* 5/2017 Tu ...................... H01H 13/7065

* cited by examiner

ELECTRONIC DEVICE INCLUDING KEY

CROSS-REFERENCE TO RELATED APPLICATION(S) AND CLAIM OF PRIORITY

The present application is related to and claims the priority under 35 U.S.C. § 119(a) to Korean Application Serial No. 10-2016-0019893, which was filed in the Korean Intellectual Property Office on Feb. 19, 2016, the entire content of which is hereby incorporated by reference.

TECHNICAL FIELD

The present disclosure relates to an electronic device, and more specifically, to an electronic device that includes a key.

BACKGROUND

In general, electronic devices, such as a portable terminal, a portable multimedia player (PMP), and an MPEG-1 audio layer-3 (MP3), refer to devices with which users may use various types of content while carrying them. Users mostly use portable electronic devices while moving thanks to easy portability and various functions loaded therein. The portable electronic devices have various form factors according to applications, the trends of the times, or consumers' requirements, and in recent years, bar-type electronic devices (such as a smart phone, a tablet PC, and the like) having a variety of functions have been widely used.

These portable terminals have various types of keys installed on the front, rear, and side surfaces thereof. The portable terminals may have home keys using fingerprint recognition sensors in order to enhance security and usability.

SUMMARY

A home key provided in an electronic device in the related art has a structure in which it is closely coupled to a bracket of the electronic device through press-fitting. For example, the home key has an assembly structure in which one side of a flange of the home key is inserted into a hole of the bracket provided below the home key, and the opposite side of the flange of the home key is then press-fit into the hole of the bracket such that the outer periphery of the flange of the home key is inserted into, and stopped by, the hole of the bracket.

When the flange of the home key is assembled into the hole of the bracket through press-fitting, the flange may deform so that the home key may be damaged, and the home key in the related art has to include a separate waterproofing member in order to block fluid introduced through the hole formed in the bracket, which may lead to an increase in the manufacturing cost.

In another example, a home key in the related art may have a semi-modular structure in which the home key is brought into contact with a separate key switch provided in an electronic device after being assembled into a hole of a bracket in order to provide a sense of clicking the key. As a result, the rear surface of the home key and the key switch have to face each other in order to provide the sense of clicking the key, which may lead to a defect in the sense of clicking.

To address the above-discussed deficiencies, it is a primary object to provide an electronic device that includes a key, in which a dummy is configured such that a key having a key switch mounted thereon is provided in an electronic device housing so as to be pressed and is separated from the housing according to attachment/detachment. The embodiments of this disclosure may make it possible to facilitate a faster assembly of the key and to reduce the assembly process time for the key. Additionally, the embodiments of the disclosure may prevent damage according to the assembly of the key, and simplify assembly and disassembly that are required in an occurrence of a defect in a sense of clicking the key. Finally, through the embodiments herein, it may not be necessary to couple the key through press-fitting and/or to form a through-hole in a structure in order to install the key switch such that the embodiments herein may also be directed toward a waterproof phone.

According to various embodiments of the present disclosure, an electronic device that includes a key may include an electronic device housing having a through-hole formed therein and a key exposed through the through-hole. The key may be capable of being pressed and a key switch may be disposed on the rear surface of the key. The key switch may be configured to enable the key to be pressed and to detect the press of the key. In some embodiments, a structure may be provided on the lower portion of the electronic device housing and be configured to bear the press of the key while facing the key switch. Additionally, a dummy may be detachably provided between the housing and the structure. In some embodiments, the dummy, when in an attached state, may support the key and the key switch such that the key and the key switch are capable of being pressed in the through-hole.

According to various embodiments of the present disclosure, the dummy may be configured, in the housing of the electronic device, to enable the key having the key switch mounted thereon to be assembled through stacking or disassembled according to attachment/detachment. In various embodiments, assembly and/or disassembly via the aforementioned methods, may reduce an amount of, reduce a severity of, or prevent damage generated when the key is assembled to, and disassembled from, the electronic device. Furthermore, an advantage may be that replacing and/or re-assembling the key may be an easy and simple task, if a breakdown of the key occurs.

According to various embodiments of the present disclosure, the key and the key switch may be combined into a module by mounting the key switch on the rear surface of the key. Mounting the key switch on the rear surface of the key may reduce an assembly process time for the key and enhance identification of a sense of clicking the key. Moreover, assembly in this manner may simplify the assembly of the key into the electronic device.

According to various embodiments of the present disclosure, a housing and a structure of the electronic device may be hermetically sealed using first, second, and third adhesive members. A flexible printed circuit board (FPCB) extending from a key of the device may be attached through stacking and simultaneously sealed, thereby reducing or preventing moisture introduced from the outside from infiltrating into the electronic device through the FPCB and the surface therearound. According to various embodiments, a structure such as this may implement a waterproofing function for the electronic device and reduce a product manufacturing cost without using an additional, separate waterproofing member.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
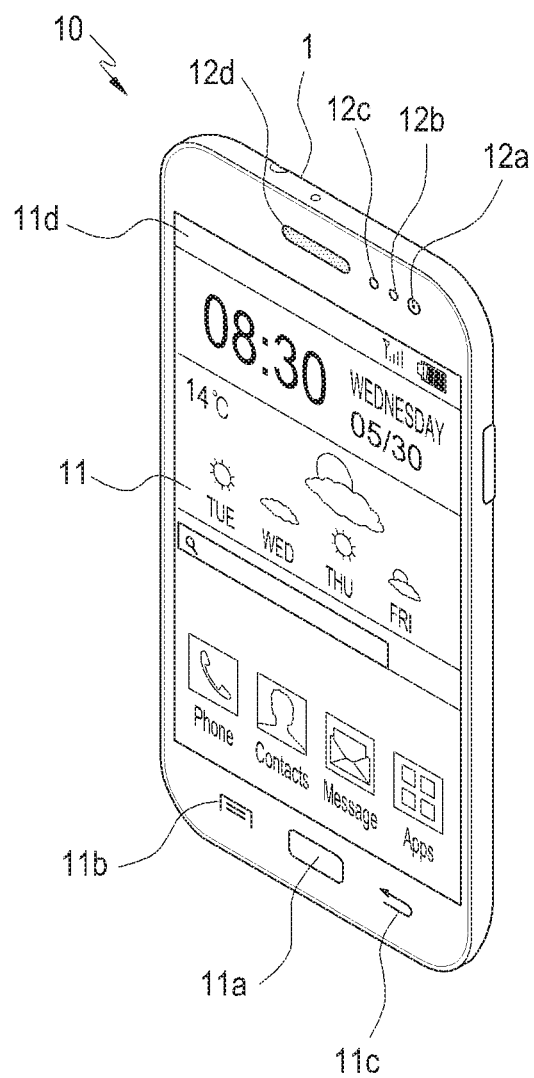
FIG. 1 is a front perspective view of an electronic device that includes a key according to various embodiments of the present disclosure.

FIGS. 1 through 18C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

Figure 2:
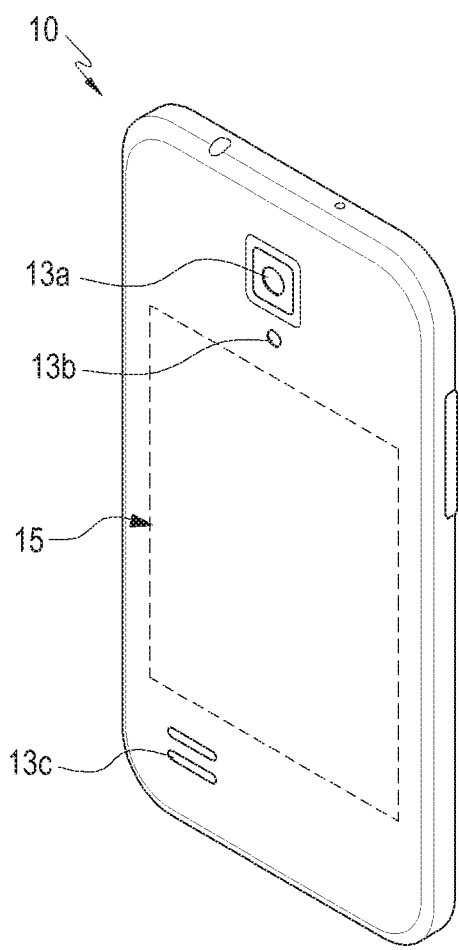
FIG. 2 is a rear perspective view of an electronic device that includes a key, according to the various embodiments of the present disclosure.

FIG. 1 is a front perspective view of an electronic device. FIG. 2 is a rear perspective view of the electronic device. The electronic device 10 may be a smart phone or a wearable device. Components constituting the electronic device, such as a smart phone, will be described with reference to FIGS. 1 and 2.

As illustrated in FIG. 1, a touch screen 11 may be disposed in the center of the front surface of the electronic device 10. The touch screen 11 may cover most of the front surface of the electronic device 10. FIG. 1 shows an illustration in which the main home screen is displayed on the touch screen 11. The main home screen is the first screen that is displayed on the touch screen 11 when the electronic device 10 is turned on. Furthermore, in a case where the electronic device 10 has several pages of different home screens, the main home screen may be the first of the several pages of home screens. Short-cut icons for executing frequently used applications, a main menu switching key, time, weather, and the like may be displayed on the home screen. The main menu switching key may be used to display a menu screen on the touch screen 11. Furthermore, a status bar 11d may be formed on the upper side of the touch screen 11 to display states, such as a battery charging state, the strength of a received signal, and the current time. A home key 11a, a menu button 11b, and a back button 11c may be formed on the lower side of the touch screen 11.

The home key 11a may be used to display the main home screen on the touch screen 11. For example, when the home key 11a is touched while any home screen different from the main home screen or the menu screen is displayed, the main home screen may be displayed on the touch screen 11. Furthermore, when the home key 11a is touched while applications are being executed on the touch screen 11, the main home screen may be displayed on the touch screen 11. Also, the home key 11a may also be used to display recently used applications, or a task manager, on the touch screen 11. The menu button 11b may be used to provide a connectivity menu that may be used on the touch screen 11. The connectivity menu may include a widget addition menu, a background image switching menu, a search menu, an editing menu, an environment setting menu, etc. The back button 11c may display the screen executed just before the currently executed screen, or may end the most recently used application.

In another embodiment, the home key 11a may have an electronic component (such as a finger scan sensor) embedded therein to receive a fingerprint input by a user. The home key 11a may also be used as a function key with various electronic components (such as a heart rate monitor (HRM)) embedded therein, in addition to the finger scan sensor.

The home key 11a, which includes the finger scan sensor, may not only be used as a function key that is capable of driving the electronic device at the same time that the home key 11a is pressed, but may also perform a click operation.

According to various embodiments of the present disclosure, the electronic device 10 may include a first camera 12a, an illuminance sensor 12b, or a proximity sensor 12c, or a speaker 12d disposed on the upper front side thereof, as illustrated in FIG. 1 mentioned above.

As illustrated in FIG. 2, the electronic device 10 may include a second camera 13a, a flash 13b, or a speaker 13c on the rear surface thereof. If the electronic device 10 is configured such that a battery pack is detachable, the rear surface of the electronic device 10 may be a detachable battery cover 15.

Figure 3:
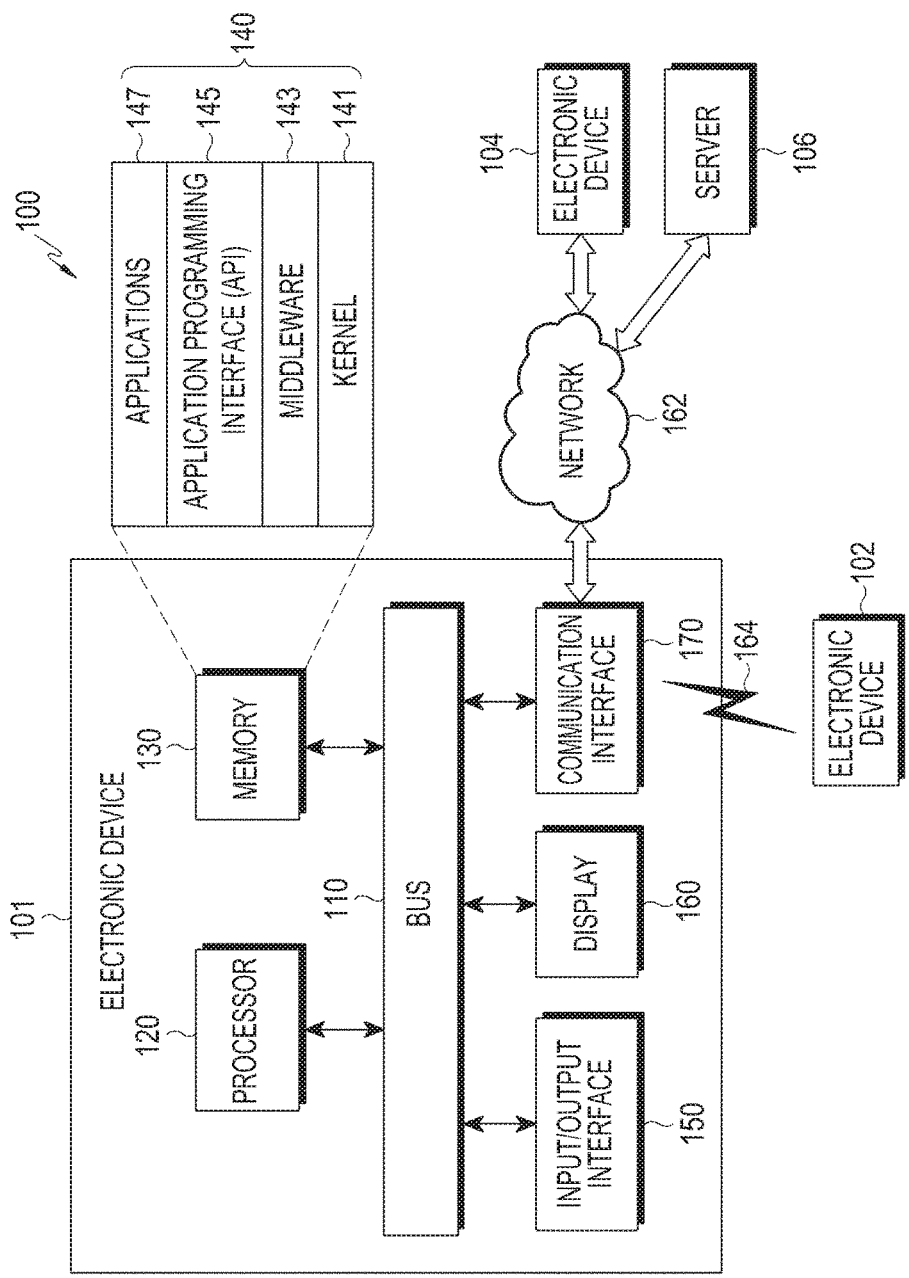
FIG. 3 is a block diagram of a network environment that includes an electronic device that includes a key, according to various embodiments of the present disclosure.

Referring to FIG. 3, an electronic device 101 may include a bus 110, a processor 120, a memory 130, an input/output interface 150, a display 160, and a communication interface 170. In some embodiments, the electronic device 10 may omit at least one of the elements, or may further include other elements. In various embodiments, electronic device 101 may be, for example, electronic device 10 as in FIGS. 1 and 2.

The bus 110 may include, for example, a circuit that interconnects the various elements 110 to 170 and delivers communication (for example, a control message and/or data) between the elements.

The processor 120 may include one or more of a Central Processing Unit (CPU), an Application Processor (AP), and a Communication Processor (CP). The processor 120, for example, may carry out operations or data processing relating to the control and/or communication of at least one other element of the electronic device 101.

The memory 130 may include a volatile and/or non-volatile memory. The memory 130 may store, for example, commands or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least one of the kernel 141, the middleware 143, and the API 145 may be referred to as an Operating System (OS).

The kernel 141 may control or manage system resources (for example, the bus 110, the processor 120, the memory 130, etc.) that are used for executing operations or functions implemented in other programs (for example, the middleware 143, the API 145, or the application programs 147). Furthermore, the kernel 141 may provide an interface by which the middleware 143, the API 145, or the application programs 147 may access the individual elements of the electronic device 101 to control or manage the system resources.

The middleware 143 may function as, for example, an intermediary for allowing the API 145 or the application programs 147 to communicate with the kernel 141 to exchange data.

Furthermore, the middleware 143 may process one or more task requests received from the application programs 147 according to priorities thereof. For example, the middleware 143 may assign priorities for using the system resources (for example, the bus 110, the processor 120, the memory 130, etc.) of the electronic device 101 to one or more of the application programs 147. For example, the middleware 143 may perform scheduling or load balancing on the one or more task requests by processing the one or more task requests according to the priorities assigned to the one or more application programs.

The API 145, which is an interface by which the applications 147 control functions provided by the kernel 141 or the middleware 143, may include, for example, at least one interface or function (for example, command) for file control, window control, image processing, text control, etc.

The input/output interface 150 may function as, for example, an interface that is capable of forwarding commands or data, which are input from a user or an external device, to the other element(s) of the electronic device 101. Furthermore, the input/output interface 150 may output commands or data, which are received from the other element(s) of the electronic device 101, to the user or the external device.

Examples of the display 160 may include a Liquid Crystal Display (LCD), a Light-Emitting Diode (LED) display, an Organic Light-Emitting Diode (OLED) display, a MicroElectroMechanical Systems (MEMS) display, and an electronic paper display. The display 160 may display, for example, various types of content (for example, text, images, videos, icons, symbols, etc.) for a user. The display 160 may include a touch screen and may receive, for example, a touch, gesture, proximity, or hovering input using an electronic pen or a part of a user's body.

The communication interface 170 may configure, for example, communication between the electronic device 101 and an external device (for example, a first external electronic device 102, a second external electronic device 104, or a server 106). For example, the communication interface 170 may be connected to a network 162 through wireless or wired communication to communicate with the external device (for example, the second external electronic device 104 or the server 106).

The wireless communication may use, for example, at least one of Long Term Evolution (LTE), LTE-Advance (LTE-A), Code Division Multiple Access (CDMA), Wideband CDMA (WCDMA), Universal Mobile Telecommunications System (UMTS), Wireless Broadband (WiBro), Global System for Mobile Communications (GSM), and the like, as a cellular communication protocol. In addition, the wireless communication may include, for example, short range communication 164. The short range communication 164 may include, for example, at least one of WiFi, Bluetooth®, Near Field Communication (NFC), Global Navigation Satellite System (GNSS), etc. The GNSS may include, for example, at least one of a Global Positioning System (GPS), a Global Navigation Satellite System (Glonass®), a Beidou® Navigation Satellite System (hereinafter, referred to as "Beidou"), and a European Global Satellite-based Navigation System (Galileo®) according to a service area, a bandwidth, or the like. Hereinafter, the "GPS" may be interchangeably used with the "GNSS" in the present disclosure. The wired communication may include, for example, at least one of a Universal Serial Bus (USB), a High Definition Multimedia Interface (HDMI), Recommended Standard 232 (RS-232), a Plain Old Telephone Service (POTS), etc. The network 162 may include a telecommunication network, which may be, for example, at least one of a communication network (e.g., a LAN or a WAN), the Internet, and a telephone network.

Each of the first and second external electronic devices 102 and 104 may be of the same type or a different type from the electronic device 101. According to an embodiment, the server 106 may include a group of one or more servers. According to various embodiments, all or some of the operations executed in the electronic device 101 may be executed in another electronic device or a plurality of electronic devices (for example, the electronic devices 102 and 104 or the server 106). According to an embodiment, when the electronic device 101 has to perform some functions or services automatically or in response to a request, the electronic device 101 may request another device (for example, the electronic device 102 or 104 or the server 106) to perform at least some functions relating thereto instead of, or in addition to, performing the functions or services by itself. The other electronic device (for example, the electronic device 102 or 104 or the server 106) may perform the requested functions or the additional functions and may deliver the execution result to the electronic device 101. The electronic device 101 may provide the received result as it is, or may additionally process the received result to provide the requested functions or services. To this end, for example, cloud computing, distributed computing, or client-server computing technology may be used.

An electronic device 200, which will be described below, may be one of a wearable device, a notebook computer, a net-book computer, a smart phone, a tablet PC, a Galaxy Tab, an iPad, and a wireless charging device mentioned above. In this embodiment, the electronic device may be a smart phone.

The electronic device, according to various embodiments of the present disclosure, may recharge the battery thereof by wirelessly transmitting/receiving power in a close range by a wireless charging device.

In addition, the display unit of the electronic device may become larger and may implement a luxurious design by minimizing the bezel area thereof, or may be implemented to be flexible, convex, or concave.

That is, the peripheral portion of the display unit may be bent so that the view area may extend to the lateral side portion. As the view area of the display unit is bent to extend to the lateral side portion, the view area may be enlarged, a separate screen may be used in the lateral side portion, or a luxurious design may be implemented. According to an embodiment, the display unit may include a first view area and second view areas on opposite sides of the first view area.

Figure 4:
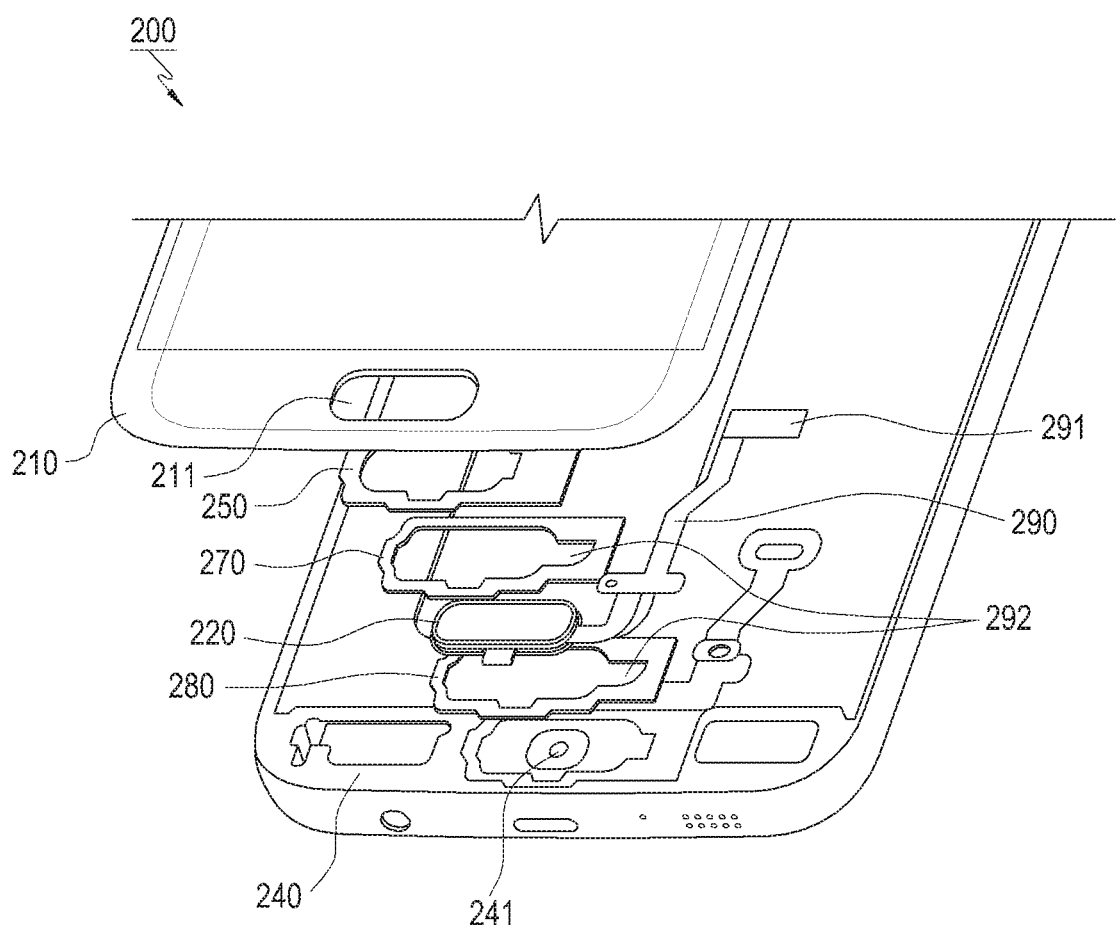
FIG. 4 is an exploded perspective view illustrating elements of an electronic device that includes a key, according to various embodiments of the present disclosure.

FIGS. 4 through 12 illustrate an electronic device, in which like reference numerals represent like parts, according to various embodiments of the present disclosure. FIG. 4 is an exploded perspective view illustrating elements of an electronic device 200 that includes a key 220 according to various embodiments of the present disclosure.

Among constituent components of the electronic device 200 that includes the key 220, the home key 220 will be described with reference to FIG. 4 in this embodiment. More specifically, the electronic device 200 may include a housing 210 having a through-hole 211 formed therein, the key 220, a key switch 230 (mounted to a bottom of the key and not shown in FIG. 4), a structure 240, and a dummy 250.

The housing 210 may include a window, and the key 220, which will be described below, may be provided on one surface of the window. The key 220 may be provided on one surface of the housing 210 such that a user may easily bring his/her finger into contact with the key 220 for fingerprint recognition.

For example, the key 220 may be configured to be exposed to the outside and to be pressed through the through-hole 211 of the housing 210.

The key switch 230 may be located on the rear surface of the key 220 to enable the key 220 to be pressed and to detect the press of the key 220.

The structure 240 may be provided on the lower portion of the electronic device 200 to face the key switch 230 and to bear the press of the key 220.

The dummy 250 may be provided between the housing 210 and the structure 240 so as to be detachable from the housing 210 and the structure 240. For example, the dummy 250, when being attached to the structure 240, may support the key 220 and the key switch 230 such that the key 220 and the key switch 230 may be pressed in the through-hole 211. The dummy 250 may be stopped by a flange 221 (illustrated in FIGS. 8 and 9) that protrudes from the outer periphery of the key 220 so as to resist or prevent the dummy from escaping from the through-hole 211.

The dummy 250 may separate the key 220 and the key switch 230 from the through-hole 211 when being detached from the housing 210 and the structure 240. For example, when the housing 210 is detached from the dummy 250 and the dummy 250 is then detached from the structure 240, the dummy 250 and the flange 221 (illustrated in FIGS. 8 and 9) of the key 220 may be separated from each other, and the key 220 and the key switch 230 may be separated from the structure 240.

As described above, the dummy 250 may be provided so as to be detachable from the housing 210 and the structure 240 so that the key 220 having the key switch 230 integrally mounted thereon may be provided in the housing 210 so as to be pressed and may be separated from the housing 210, which makes it possible to reduce an amount or to prevent damage to the key 220 which may be caused by press-fitting of the key 220 into the structure 240, to facilitate the assembly of the key 220, and to reduce the assembly process time for the key 220. In addition, since it is not necessary to separately form a coupling hole through which the key switch 230 is coupled in order to install the key switch 230, an application may also be made to a waterproof phone.

Figure 5:
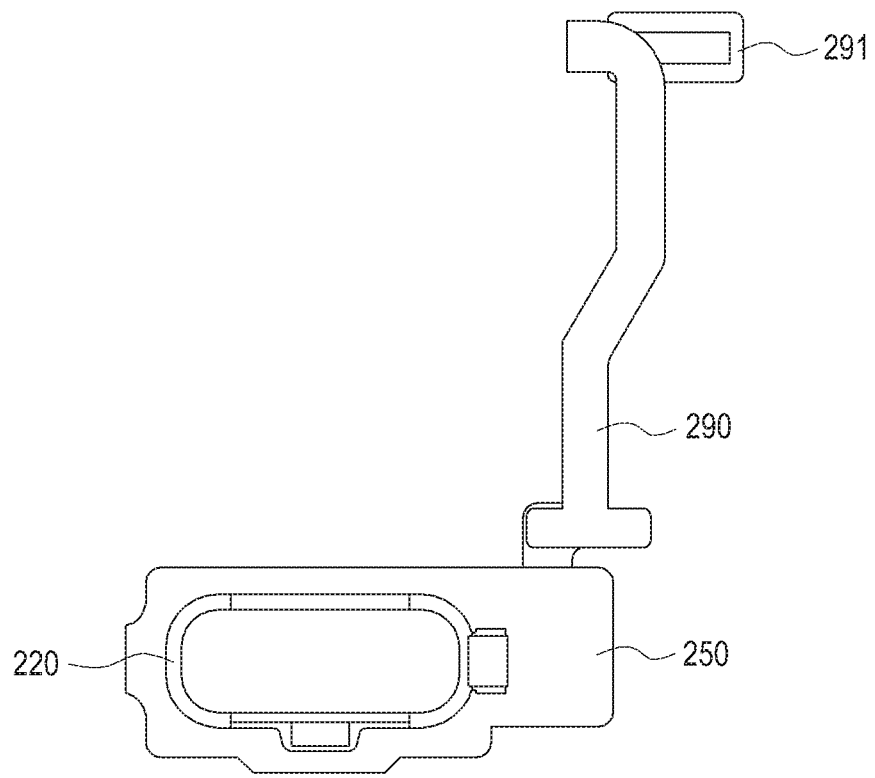
FIG. 5 is an isolated front view illustrating a coupling state of a modularized key of an electronic device, the modularized key having a key switch mounted thereto, according to the various embodiments of the present disclosure.
Figure 6:
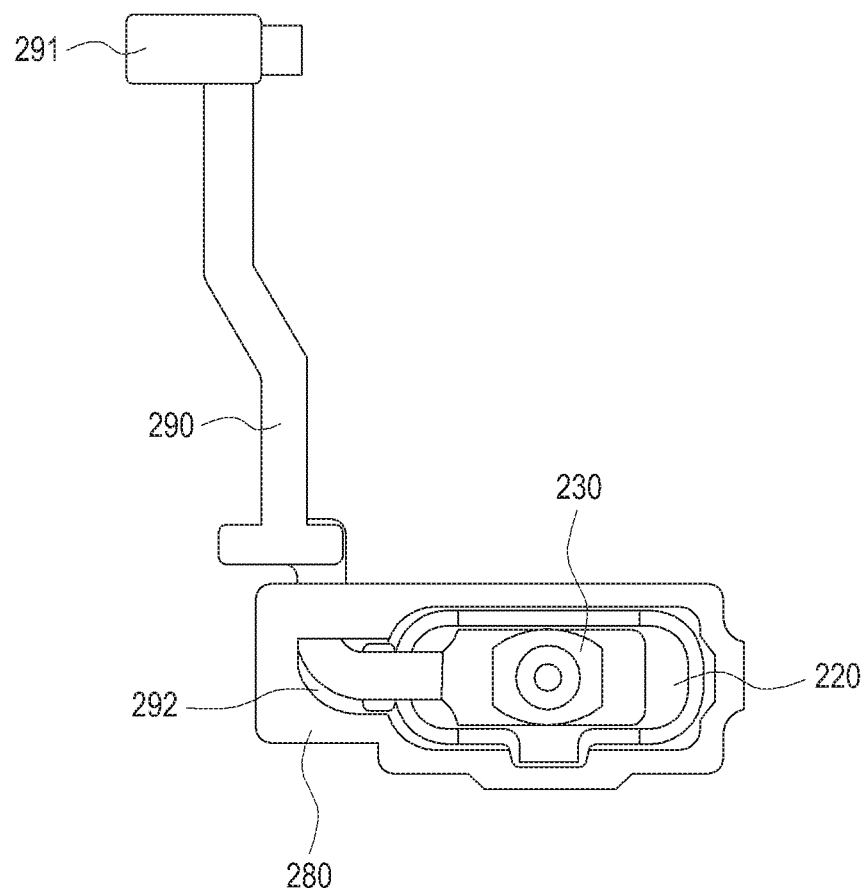
FIG. 6 is an isolated rear view illustrating the coupling state of the modularized key (as illustrated in FIG. 5), wherein the modularized key has a key switch mounted thereto, according to the various embodiments of the present disclosure.

FIG. 5 is a plan view illustrating a coupling state of the modularized key 220 among the elements of the electronic device 200 according to the various embodiments of the present disclosure, and FIG. 6 is a bottom view illustrating the coupling state of the modularized key 220 among the elements of the electronic device according to the various embodiments of the present disclosure.

As illustrated in FIGS. 5 and 6, the key switch 230 may be disposed in a reverse dome shape on the rear surface of the key 220 such that it is turned upside down and protrudes downward from the rear surface of the key 220. For example, the key switch 230 may be a dome switch. While the dome switch is turned upside down, the large area of the dome switch may be closely attached to the rear surface of the key 220, and the small area of the dome switch may be brought into contact with a mounting portion 241 formed on the structure 240 while facing the mounting portion 241. Accordingly, when the key 220 is pressed, a sense of clicking may be identified by means of the key switch 230.

Figure 10:
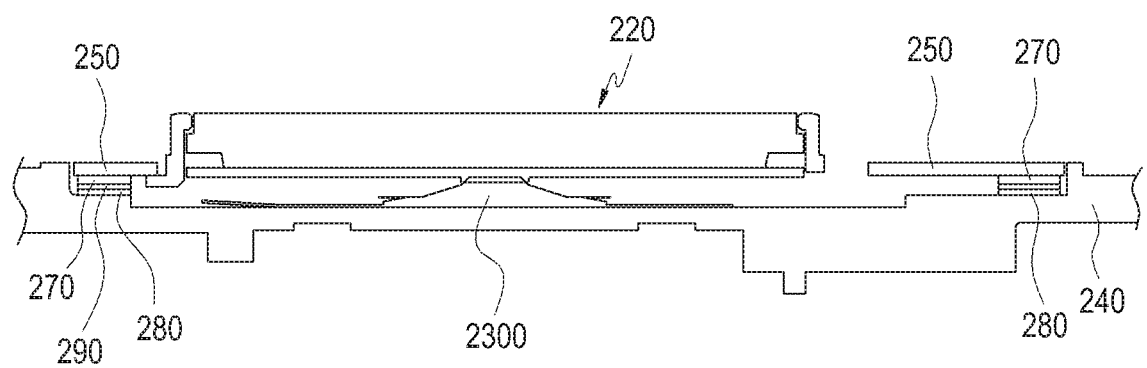
FIG. 10 is a side sectional view illustrating another embodiment in which the key switch is mounted to a key, among the elements of the electronic device that includes a key, according to the various embodiments of the present disclosure.

FIG. 10 is a side sectional view illustrating another embodiment in which a key switch 2300 is mounted among the elements of the electronic device according to the various embodiments of the present disclosure.

Referring to FIG. 10, the key switch 2300 may be disposed on the upper surface of the structure 240 so as to be directed opposite to the reverse dome. For example, the key switch 2300 may be disposed on the structure 240 so as to protrude from the structure 240, instead of protruding from the rear surface of the key 220.

Figure 7:
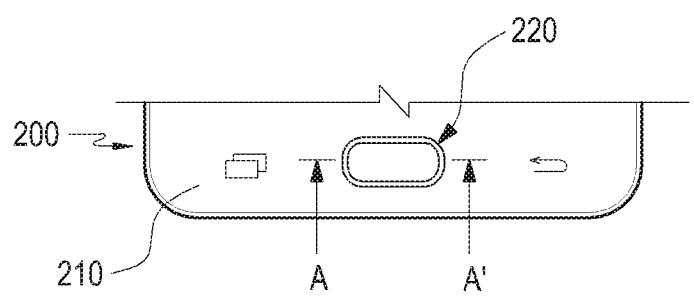
FIG. 7 is an isolated bottom end view illustrating a coupling state of the electronic device that includes the key, according to the various embodiments of the present disclosure.
Figure 8:
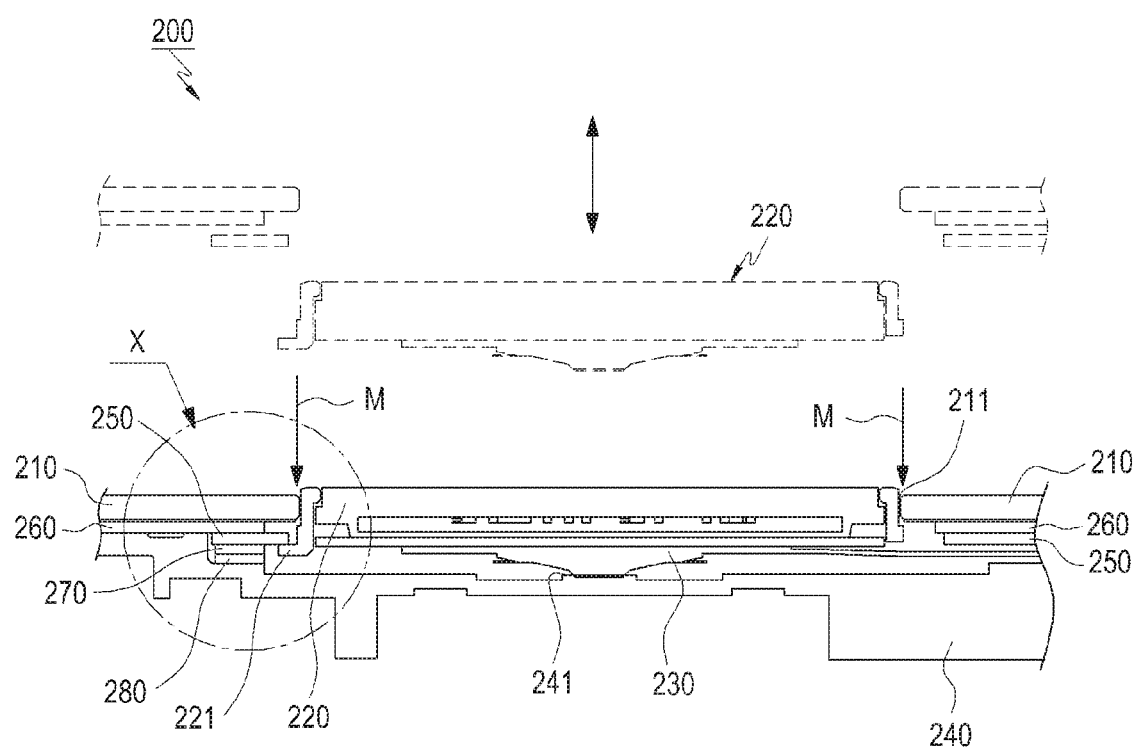
FIG. 8 is a sectional view taken along line A-A' of FIG. 7, according to various embodiments of the present disclosure.
Figure 9:
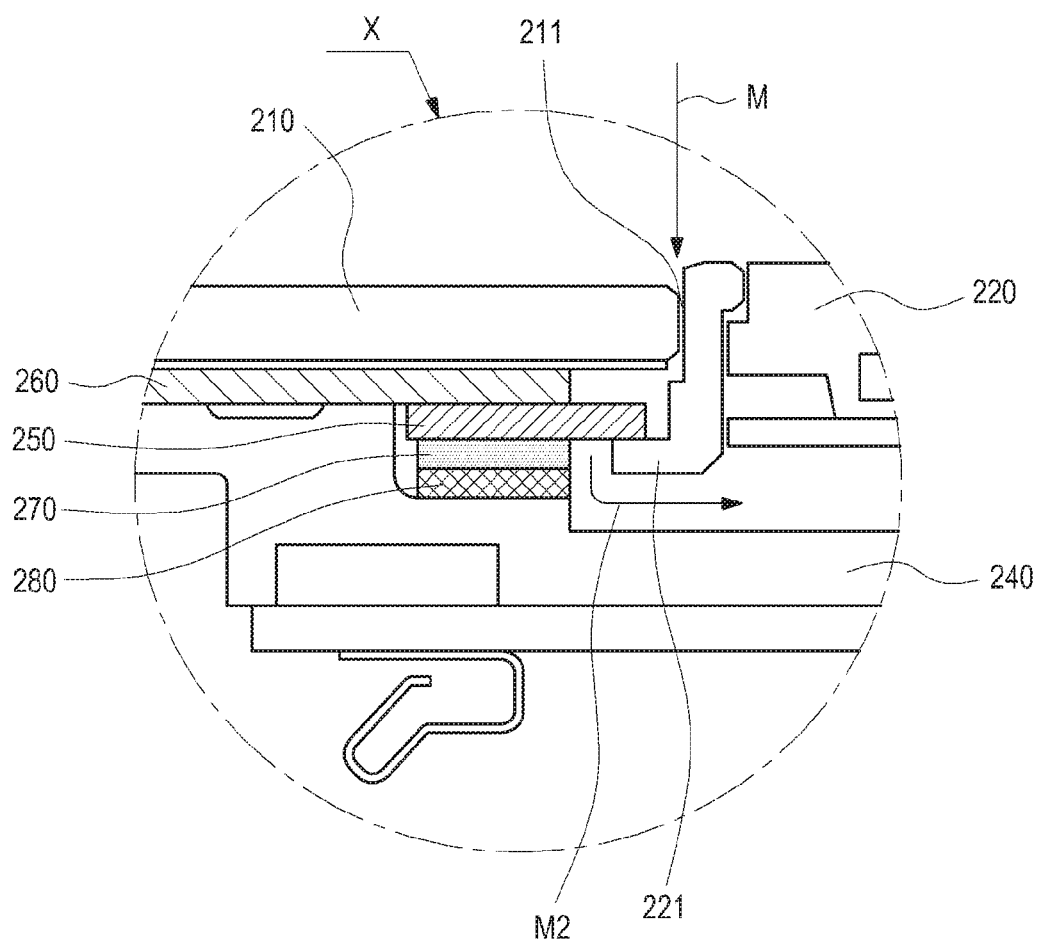
FIG. 9 is an enlarged side sectional view of portion X of FIG. 8, according to various embodiments of the present disclosure.

FIG. 7 is a plan view illustrating a coupling state of the electronic device that includes the key 220 according to the various embodiments of the present disclosure. FIG. 8 is a sectional view taken along line A-A' of FIG. 7. FIG. 9 is an enlarged side sectional view of portion 'X' of FIG. 8.

Referring to FIGS. 7 to 9, a first adhesive member 260 may be provided between the housing 210 and the upper surface of the dummy 250 to attach the dummy 250 to the housing 210, and second and third adhesive members 270 and 280 may be provided between the lower surface of the dummy 250 and the structure 240 to attach the dummy 250 to the structure 240. For example, the third adhesive member 280 may be attached to the upper surface of the structure. The second adhesive member 270 may be attached to the upper surface of the third adhesive member 280. The key 220 and the key switch 230 may be assembled to the mounting portion 241 of the structure 240. The dummy 250 may be stopped by the flange 221 (illustrated in FIGS. 8 and 9) of the key 220 while the rear surface of the dummy 250 is being attached to the upper surface of the second adhesive member 270 such that the key 220 and the key switch 230 may be assembled. The first adhesive member 260 may be attached to the upper surface of the dummy 250. The rear surface of the housing 210 may be attached to the upper surface of the first adhesive member 260. In this case, the key 220 may be exposed to the outside through the through-hole 211 of the housing 210 such that the key 220 may be pressed.

According to various embodiments of the present disclosure, as illustrated in FIG. 8, the key switch 230 may convexly protrude in a U shape to form an embossing shape, and the distal end of the protruding portion may form a mounting portion contact surface having a boss shape in order to help the key switch 230 pressed while making contact with the mounting portion 241. When the key is pressed while the protruding portion of the key switch 230 is brought into contact with the mounting portion 241, the key switch 230 protruding in a U shape may deform while being pressed, and when the press of the key 220 is released, the deformed key switch 230 may move upwards while returning to its original state, thereby providing a sense of clicking the key 220. As described above, the key switch 230 may deform with the press of the key 220, which makes it possible to identify a sense of clicking. In this case, the key switch 230 may be electrically connected to allow the key 220 to operate as a home key.

Figure 11:
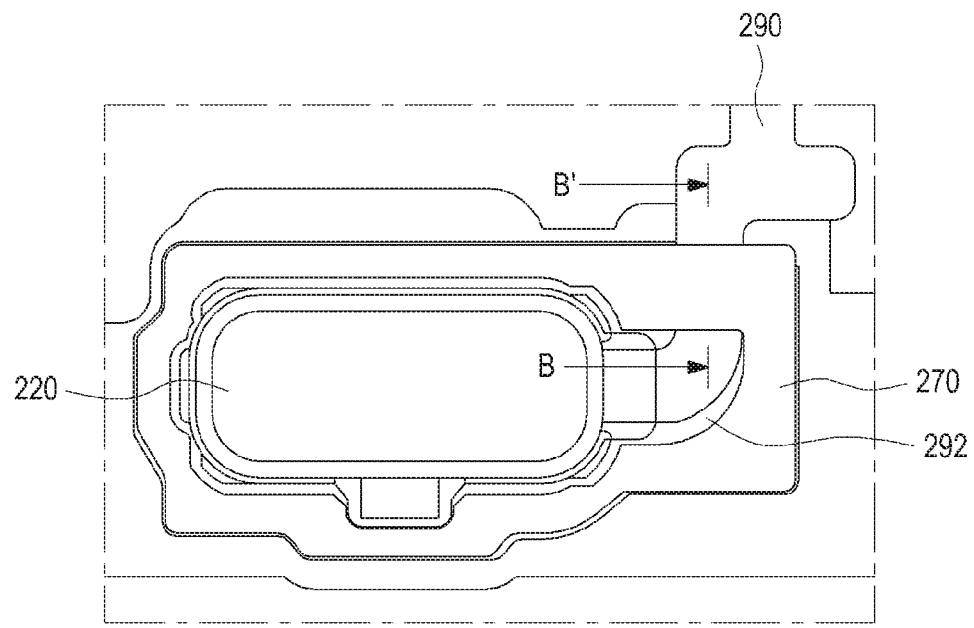
FIG. 11 is an isolated view illustrating a coupling state between the modularized key and the first to third adhesive members, according to the various embodiments of the present disclosure.
Figure 12:
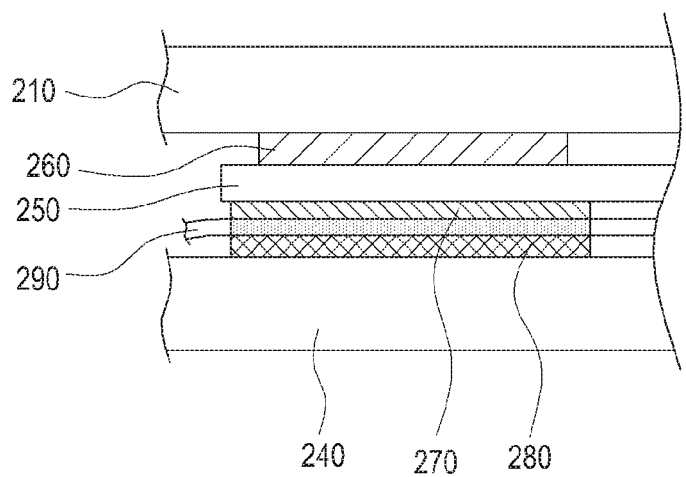
FIG. 12 is a sectional view taken along line B-B' of FIG. 11, according to various embodiments of the present disclosure.

FIG. 11 is a plan view illustrating a coupling state between the modularized key 220 and the first to third adhesive members among the elements of the electronic device according to the various embodiments of the present disclosure, and FIG. 12 is a sectional view taken along line B-B' of FIG. 11.

Referring to FIGS. 11 and 12, the key 220 may include a flexible printed circuit board (FPCB) 290 that is coupled through the second and third adhesive members 270 and 280 to electrically connect the key 220 and a printed circuit board (not illustrated) provided in the electronic device 200. The FPCB 290 may extend from a part of the key 220 to form a waterproofing structure by means of the second and third adhesive members 270 and 280.

For example, the waterproofing structure may include the first to third adhesive members 260, 270, and 280, as illustrated in FIG. 11.

The first adhesive member 260 may be provided between the housing 210 and the dummy 250. The upper surface of the first adhesive member 260 may be attached to the rear surface of the housing 210, and the rear surface of the first adhesive member 260 may be attached to the upper surface of the dummy 250.

The second adhesive member 270 may be provided between the dummy 250 and the FPCB 290. The upper surface of the second adhesive member 270 may be attached to the rear surface of the dummy 250, and the rear surface of the second adhesive member 270 may be attached to the upper surface of the FPCB 290.

The third adhesive member 280 may be provided between the FPCB 290 and the structure 240. The upper surface of the third adhesive member 280 may be attached to the rear surface of the FPCB 290, and the rear surface of the third adhesive member 280 may be attached to the upper surface of the structure 240.

The FPCB 290 may extend from the key 220 so as to be electrically connected to the printed circuit board provided in the electronic device 200 while the second and third adhesive members 270 and 280 are attached to the FPCB 290.

Extension holes 292 may be formed to be sufficiently wide to increase the degree of freedom of the portions of the FPCB 290 connected with the second and third adhesive members 270 and 280 when the key 220 is pressed.

For example, the extension holes may be formed to be sufficiently wide to allow the FPCB 290 extending from the key to be flexibly pressed or moved in the up-down direction when the key is vertically pressed.

According to various embodiments of the present disclosure, the first to third adhesive members 260, 270, and 280 may hermetically seal the FPCB 290.

Even though moisture M infiltrates between the electronic device housing 210 and the key 220 in this state, as illustrated in FIGS. 8 and 9 using M to indicate an initial direction of the moisture and M2 being the area where the moisture may infiltrate, the moisture may be collected on the upper surface of the structure 240 since the structure 240 has no hole, and the first to third adhesive members 260, 270, and 280 may prevent the moisture from infiltrating into the structure 240, thereby blocking the moisture M from flowing to the printed circuit board (not illustrated) provided in the electronic device 200.

For example, the moisture M may be prevented from infiltrating into the electronic device housing 210 (for example, the area designated by M2) and the structure 240 by using the first to third adhesive members 260, 270, and 280, and the moisture M introduced from the outside may be prevented from infiltrating into the electronic device 200 through the FPCB by stacking and attaching the FPCB 290 extending from the key and hermetically sealing the electronic device 200, which makes it possible to implement the waterproofing function of the electronic device.

Each of the first to third adhesive members 260, 270, and 280 may be constituted by a double-sided tape and an adhesive.

The FPCB 290 may have a connector 291 on one end thereof and a key 220, for example, a home key, a key button, a fingerprint recognition sensor, a connector, a printed circuit board (PCB), a detection sensor, an optical sensor, a temperature sensor, a vein sensor, a human-body detection sensor, or a biometric sensor, on the other end thereof.

The disclosed components are described as examples in this embodiment, but the present disclosure is not limited thereto. That is, any components that may be provided on the opposite ends of the FPCB 290 may be applied to various modified embodiments. For example, the components may include components of all electronic devices that are electrically connected by the FPCB 290.

Here, the key 220 may be the home key 220, and the home key 220 may include a fingerprint recognition sensor unit (not illustrated) that is capable of recognizing a user's fingerprint, or may perform a click operation according to a press similarly to a mechanical button key 220.

According to an embodiment, the home key 220 may protrude through the through-hole 211 formed in the housing 210 of the electronic device and may be simultaneously exposed through the through-hole 211. In this state, a user's finger slides along the surface of the housing 210 and slides on the upper end surface of the fingerprint recognition sensor unit (not illustrated) of the home key 220. When the user's fingerprint is brought into contact with the fingerprint recognition sensor unit (not illustrated), a signal pattern unit (not illustrated) of the fingerprint recognition sensor unit (not illustrated) generates a transmission (Tx) signal or a reception (Rx) signal at the same time that a plurality of transmission (Tx) lines and reception (Rx) lines detect the contact. The signal pattern unit (not illustrated) brings the transmission (Tx) signal or the reception (Rx) signal into an image, and the fingerprint image is transmitted to a controller (not illustrated). The controller (not illustrated) may compare the transmitted fingerprint image and the user's previously stored fingerprint image and may recognize the user based on the comparison result. For example, the signal pattern unit (not illustrated) detects and simultaneously signalizes the fingerprint that is input by the plurality of transmission (Tx) lines and reception (Rx) lines.

According to an embodiment, the home key 220 may generate a signal by means of a click operation according to a press similarly to a button key 220 and may apply the signal to the controller (not illustrated) provided in the electronic device through the FPCB 290. The FPCB 290 extending from the home key 220 may be electrically connected with the controller and the power supply (not illustrated) of the electronic device 200.

The controller (not illustrated) may compare the transmitted fingerprint image and the user's fingerprint image previously stored in a memory unit (not illustrated) and may recognize the user based on the comparison result, or may receive a click signal according to a press of the button key 220 to implement operations in various modes of the electronic device 200. For example, the controller may implement a voice or video call mode operation, a camera mode operation, and general operations of the electronic device. That is, a variety of content, such as a financial business, a game/multimedia service, a wireless Internet service, etc., may be used through the electronic device, as well as a voice or video call.

The structure 240 may be constituted by a front case and a bracket, and may also be constituted by other components, in addition to the front case and the bracket.

Here, a process of assembling the key 220 provided in the electronic device will be described below with reference to FIG. 4 mentioned above.

As illustrated in FIG. 4, the upper surface of the first adhesive member 260 may be attached to the outer peripheral area of the through-hole 211 formed in the housing 210 of the electronic device, and the upper surface of the dummy 250 may be attached to the rear surface of the first adhesive member 260. The upper surface of the second adhesive member 270 may be attached to the rear surface of the dummy 250. The key 220 having the key switch 230 mounted thereon may be provided to be exposed through the through-hole 211 while being stopped by the dummy 250 that is attached by the second adhesive member 270. The third adhesive member 280 may be attached to the rear surface of the second adhesive member 270, and the key switch 230 located on the rear surface of the key 220 and the mounting portion 241 of the structure 240 may face each other at the same time that the rear surface of the third adhesive member 280 is attached to the upper surface of the structure 240. In this case, the key 220 may be brought into contact with the mounting portion 241 so as to be pressed.

As described above, the first to third adhesive members 260, 270, and 280 enable the housing 210 and key 220 to be sequentially stacked on the structure 240, thereby facilitating the assembly of the key 220.

In another embodiment, the FPCB 290 extending from the key 220 may form a waterproofing structure by means of the first to third adhesive members 260, 270, and 280. For example, the FPCB 290 may be hermetically sealed by attaching the first adhesive member 260 between the housing 210 and the dummy 250, the second adhesive member 270 between the dummy 250 and the FPCB 290, and the third adhesive member 280 between the FPCB 290 and the structure 240.

Here, a process of disassembling the key 220 provided in the electronic device will be described below with reference to FIG. 4 mentioned above.

As illustrated in FIG. 4, the housing 210 may be first separated from the dummy 250 in order to disassemble the key 220 that is assembled to the electronic device. In this case, the housing 210 may be separated from the first adhesive member 260. The dummy 250 may be separated from the second adhesive member 270. In this case, the key 220 having the key switch 230 mounted to a bottom surface thereof (the key switch 230 is not shown in FIG. 4), which is stopped by the dummy 250, may be separated from the structure 240 while being released from the dummy 250. The key switch 230, which is separated together with the key 220, may be separated from the mounting portion 241 of the structure 240.

Accordingly, the key switch 230 and the key 220 may be easily separated from the structure 240 of the electronic device by separating the housing 210 and the dummy 250 in a serial order.

As described above, the key 220 having the key switch 230 mounted thereon may be sequentially assembled to the housing 210 of the electronic device through stacking and disassembled from the housing 210 according to attachment/detachment, which makes it possible to prevent, in advance, damage generated when the key 220 is assembled to, and disassembled from, the electronic device 200 and to replace and re-assemble the key 220 in an easy and simple manner in case of a breakdown in the key 220.

According to various embodiments of the present disclosure, an electronic device that includes a key may include: an electronic device housing having a through-hole formed therein; a key exposed through the through-hole and capable of being pressed; a key switch located on the rear surface of the key and configured to enable the key to be pressed and to detect the press of the key; a structure provided on the lower portion of the electronic device housing to bear the press of the key while facing the key switch; and a dummy detachably provided between the housing and the structure, and the dummy, when being attached, may support the key and the key switch such that the key and the key switch are capable of being pressed in the through-hole.

According to various embodiments of the present disclosure, the dummy may separate the key and the key switch from the through-hole when being detached.

According to various embodiments of the present disclosure, the key switch may be disposed in a reverse dome shape on the rear surface of the key, the reverse dome shape being turned upside down and protruding downward from the rear surface of the key.

According to various embodiments of the present disclosure, the structure may include a mounting portion on which one end of the key switch is mounted.

According to various embodiments of the present disclosure, a first adhesive member for attaching the dummy may be provided between the housing and the upper surface of the dummy, and second and third adhesive members for attaching the dummy to the structure may be provided between the lower surface of the dummy and the structure.

According to various embodiments of the present disclosure, the key may further include an FPCB that is coupled through the second and third adhesive members to electrically connect the key and the electronic device, and the FPCB may extend from a part of the key to form a waterproofing structure by means of the second and third adhesive members.

According to various embodiments of the present disclosure, the waterproofing structure may include: the first adhesive member provided between the housing and the dummy; the second adhesive member provided between the dummy and the FPCB; and the third adhesive member provided between the FPCB and the structure, and the second and third adhesive members may include extension holes through which the FPCB passes and extends while the second and third adhesive members are attached to the FPCB.

According to various embodiments of the present disclosure, the first to third adhesive members may include a double-sided tape or an adhesive.

According to various embodiments of the present disclosure, one of a key, a key button, a fingerprint sensor, a connector, a printed circuit board (PCB), a detection sensor, an optical sensor, a temperature sensor, a vein sensor, and a human-body detection sensor may be provided on opposite ends of the FPCB.

According to various embodiments of the present disclosure, the housing may include a window, and the structure may include a front case and a bracket.

According to various embodiments of the present disclosure, the dummy may be used for an electronic device to which the waterproofing structure is applied, or for an electronic device to which the waterproofing structure is not applied.

According to various embodiments of the present disclosure, the key and the key switch may be fixed by the housing such that the key and the key switch may not be separated from the through-hole even though the dummy is attached or detached.

A method for manufacturing the electronic device 200 that includes the key 220, according to various embodiments of the present disclosure, will be described below in detail.

Figure 13:
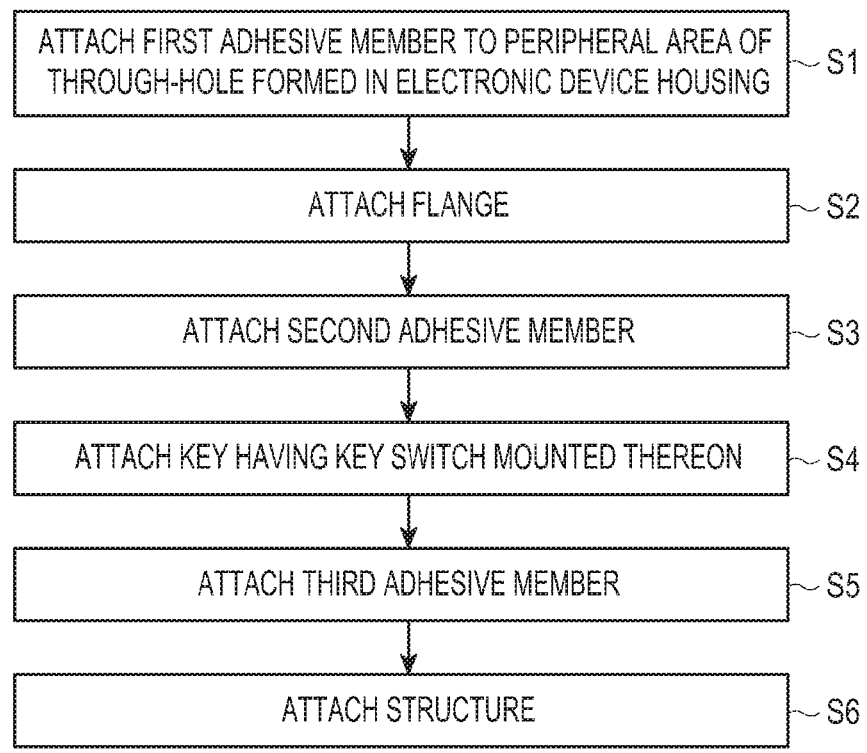
FIG. 13 is a flowchart illustrating a method for manufacturing an electronic device that includes a key, according to various embodiments of the present disclosure.

FIG. 13 is a flowchart illustrating the method for manufacturing the electronic device 200 that includes the key 220 according to the various embodiments of the present disclosure.

The method for manufacturing the electronic device 200 that includes the key 220 will be described with reference to FIG. 13. For example, the first adhesive member 260 may be attached to the peripheral area of the through-hole 211 formed in the electronic device housing 210 (Step S1).

The dummy 250 may be attached to the rear surface of the electronic device housing 210 by the first adhesive member 260 (Step S2). Thereafter, the second adhesive member 270 may be attached to the rear surface of the dummy 250 (Step S3), and the key 220 exposed through the through-hole 211 while being stopped by the dummy 250 that is attached by the second adhesive member 270 may be provided (Step S4). The key switch 230 may be mounted on the rear surface of the key 220. In this state, the third adhesive member 280 may be attached to the rear surface of the second adhesive member 270 (Step S5).

Then, the structure 240 that bears the press of the key 220 while facing the key switch 230 located on the rear surface of the key 220 may be attached by the third adhesive member 280 (Step S6).

In another embodiment, when the second and third adhesive members 270 and 280 are attached, a waterproofing structure may be formed to hermetically seal the FPCB 290 extending from a part of the key 220.

The waterproofing structure may include the first to third adhesive members 260, 270, and 280. First, the first adhesive member 260 may be attached between the housing 210 and the dummy 250. The second adhesive member 270 may be attached between the rear surface of the dummy 250 and the upper surface of the FPCB, and the third adhesive member 280 may be attached between the rear surface of the FPCB and the upper surface of the structure 240.

Even though moisture M infiltrates between the electronic device housing 210 and the key 220 in this state as illustrated by the area indicated by M2 in FIGS. 8 and 9 mentioned above, the moisture may be collected on the upper surface of the structure 240 since the structure 240 has no hole, and may not infiltrate into the electronic device. For example, the first to third adhesive members 260, 270, and 280 may block the moisture M from infiltrating into the structure 240 (to keep the moisture M from reaching area M2) to reduce an amount of moisture M or an amount of damage caused by M or to prevent the moisture M from flowing to the printed circuit board (not illustrated) that is provided in the electronic device 200.

Accordingly, the electronic device housing 210, the dummy 250, and the structure 240 may be sequentially stacked by the first to third adhesive members 260, 270, and 280, and the key 220 having the key switch 230 mounted thereon may be provided at the same time. As a result, it is possible to replace and re-assemble the key 220 in an easy and simple manner, to hermetically seal the FPCB, and to implement a waterproofing function for the electronic device.

The dummy 250 may be employed for the electronic device 200 to which the waterproofing function is applied, or the electronic device 200 to which the waterproofing structure is not applied.

According to various embodiments of the present disclosure, a method for manufacturing an electronic device that includes a key may include: attaching a first adhesive member to the peripheral area of a through-hole formed in an electronic device housing; attaching a dummy to the rear surface of the housing by means of the first adhesive member; attaching a second adhesive member to the rear surface of the dummy; providing a key stopped by the dummy, which is attached by the second adhesive member, and exposed through the through-hole; attaching a third adhesive member to the rear surface of the second adhesive member; and attaching a structure that faces a key switch located on the rear surface of the key by means of the third adhesive member and bears the press of the key.

According to various embodiments of the present disclosure, the key may further include an FPCB that is coupled through the second and third adhesive members to electrically connect the key and the electronic device, and the FPCB may extend from a part of the key to form a waterproofing structure by means of the second and third adhesive members.

According to various embodiments of the present disclosure, the waterproofing structure may include: the first adhesive member provided between the housing and the dummy; the second adhesive member provided between the dummy and the FPCB; and the third adhesive member provided between the FPCB and the structure.

A method for manufacturing the electronic device 200 that includes the key 220, according to various other embodiments of the present disclosure, will be described in detail. The modularized key 220 having the key switch 230 on the rear surface thereof may be mounted on the mounting portion 241 of the structure 240, and the housing 210 may then be attached to the upper portion of the structure 240. In this case, the key 220 may be exposed through the through-hole 211 formed in the housing 210.

The key 220 and the key switch 230, which are assembled as described above, make it possible to identify a sense of clicking the key 220 by assembling only up to the dummy 250 before the attachment of the housing 210.

A method for manufacturing the electronic device 200 that includes the key 220, according to various other embodiments of the present disclosure, will be described below in detail.

Figure 14:
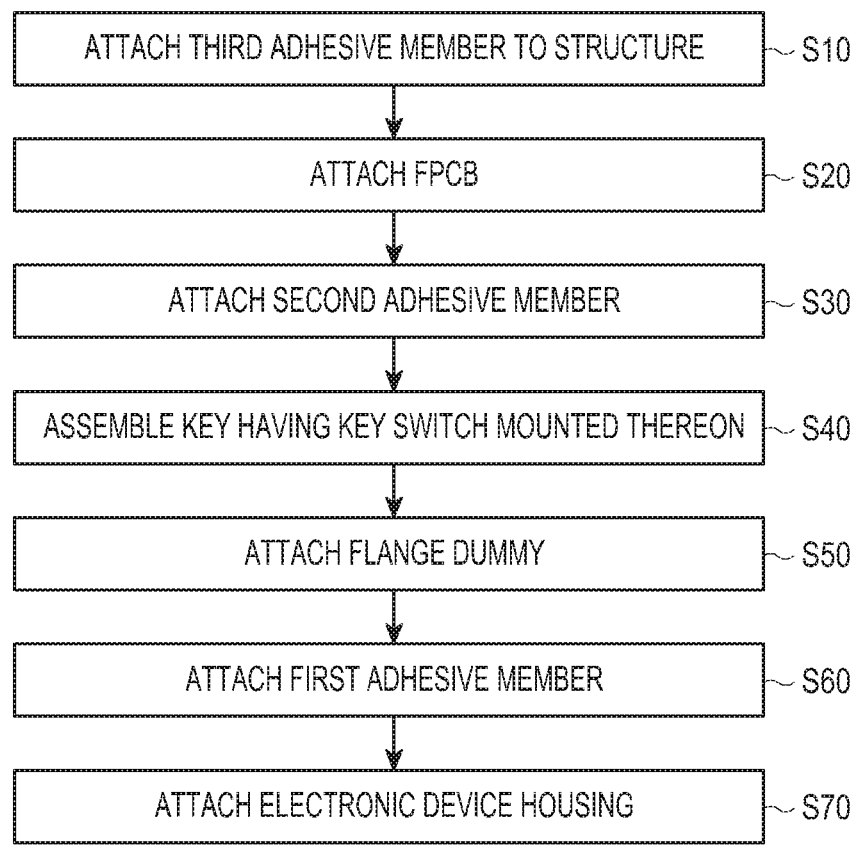
FIG. 14 is a flowchart illustrating a method for manufacturing an electronic device that includes a key, according to various embodiments of the present disclosure.

FIG. 14 is a flowchart illustrating the method for manufacturing the electronic device 200 that includes the key 220, according to the various other embodiments of the present disclosure.

Referring to FIG. 14, the third adhesive member 280 may be attached to the upper surface of the structure 240 (Step S10). The FPCB may be attached to the upper surface of the third adhesive member (Step S20). The second adhesive member 270 may be attached to the upper surface of the third adhesive member 280 and the upper surface of the FPCB (Step S30). The key 220 and the key switch 230 may be assembled to the mounting portion 241 of the structure 240 (Step S40). The rear surface of the dummy 250 may be attached to the second adhesive member (Step S50). The dummy 250 may be stopped by the flange 221 (illustrated in FIG. 9) of the key 220 to assemble the key 220 and the key switch 230, and the first adhesive member 260 may be attached to the upper surface of the dummy 250 (Step S60). The rear surface of the housing 210 may be attached to the upper surface of the first adhesive member 260 (Step S70). In this case, the through-hole 211 of the housing 210 may be exposed to the outside such that the key 220 may be pressed.

The key 220 and the key switch 230, which are assembled as described above, make it possible to identify a sense of clicking the key 220 by assembling only up to the dummy 250 before the attachment of the housing 210.

According to various embodiments of the present disclosure, a method for manufacturing an electronic device that includes a key may include: attaching a third adhesive member to a structure; attaching an FPCB by means of the third adhesive member; attaching a second adhesive member to the upper surface of the third adhesive member and the upper surface of the FPCB; assembling a key and a key switch to a mounting portion of the structure; attaching the rear surface of a dummy to the second adhesive member; attaching a first adhesive member to the upper surface of the dummy; and exposing the key through a through-hole formed in an electronic device housing while attaching the rear surface of the electronic device housing to the upper surface of the first adhesive member.

An embodiment of a dummy 350 provided in an electronic device 300 (illustrated in FIG. 15) that includes a key, according to various embodiments of the present disclosure, will be described below.

Figure 15A:
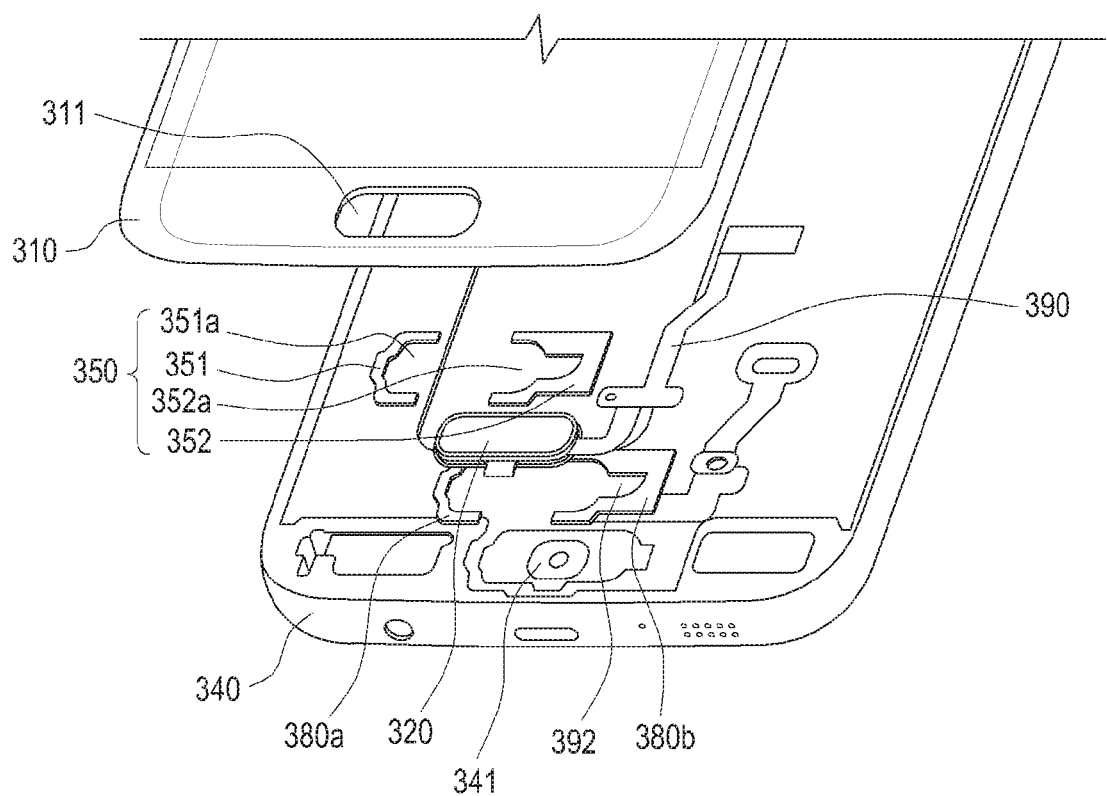
FIG. 15A is an exploded perspective view illustrating an embodiment of a dummy among elements of an electronic device that includes a key, according to various embodiments of the present disclosure.
Figure 15B:
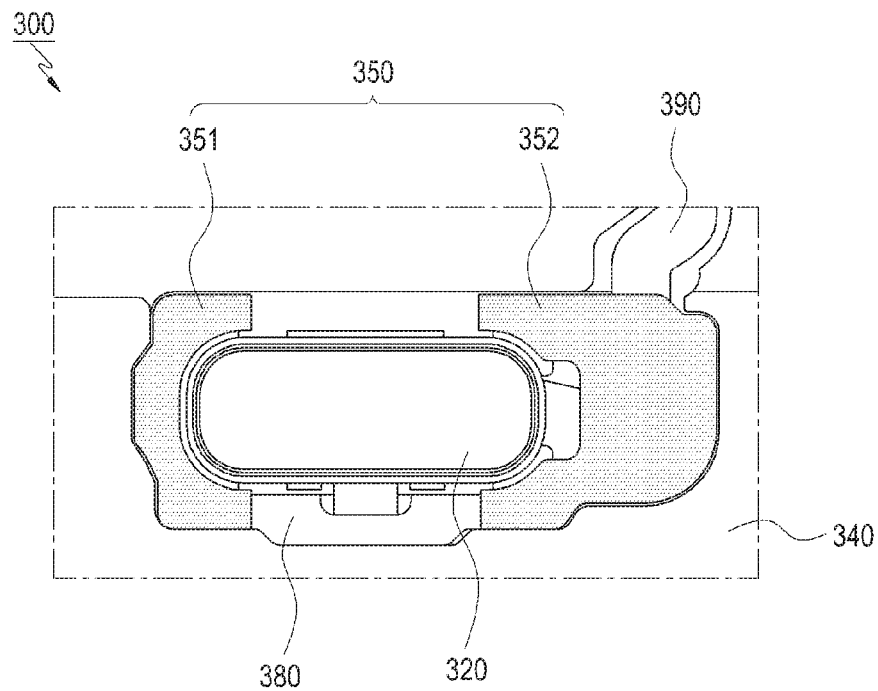
FIG. 15B is an isolated view illustrating an embodiment of the dummy, among the elements of the electronic device that includes the key, according to the various embodiments of the present disclosure.

FIG. 15A is an exploded perspective view illustrating the embodiment of the dummy 350 among elements of the electronic device 300 that includes the key according to the various embodiments of the present disclosure, and FIG. 15B is a plan view illustrating the embodiment of the dummy 350 among the elements of the electronic device 300 that includes the key according to the various embodiments of the present disclosure.

Referring to FIGS. 15A and 15B, the electronic device 300 may include a housing 310 having a through-hole 311 formed therein, a key 320 having a key switch (not illustrated) that is mounted thereon, a structure 340, and the dummy 350. Since the housing 310, the key 320 having the key switch (not illustrated) that is mounted to a bottom surface thereof, the structure 340, and first to third adhesive members (not illustrated) are the same as those illustrated in preceding FIGS. 4 and 12, detailed descriptions thereof will be omitted.

The dummy 350 may include first and second dummies 351 and 352. The first dummy 351 may be coupled to a first step of the key 320, and the second dummy 352 may be coupled to a second step that is opposite to the first step of the key 320 in a direction along line A-A' of FIG. 7.

For example, while the first and second dummies 351 and 352 are separated from each other, an insertion recess 351a of the first dummy 351 may be stopped by and coupled to a flange (not illustrated) that is formed on the first step of the key 320, and an insertion recess 352a of the second dummy 352 may be stopped by and coupled to a flange (not illustrated) that is formed on the second step of the key 320.

The first adhesive member (not illustrated) for attaching the first and second dummies 351 and 352 may be provided between the housing 310 and the upper surfaces of the first and second dummies 351 and 352, and the second and third adhesive members (not illustrated) for attaching the first and second dummies 351 and 352 to the structure 340 may be provided between the lower surfaces of the first and second dummies 351 and 352 and the structure 340. For example, the third adhesive member 380 (as shown in FIG. 15B) may include third adhesive member portions 380a and 380b (shown in FIG. 15A) and may be attached to the upper surface of the structure 340. Third adhesive member portions 380a and 380b may correspond in shape to first and second dummies 351 and 352, respectively. The second adhesive member (not illustrated) may be attached to the upper surface of the third adhesive member 380 (as shown in FIG. 15B) which may include third adhesive member portions 380a and 380b (as shown in FIG. 15A). The key and the key switch (not illustrated) may be assembled to a mounting portion 341 of the structure 340. The insertion recesses 351a and 352a first and second dummies 351 and 352 may be stopped by the flange (not illustrated) of the key 320 to assemble the key and the key switch at the same time that the rear surfaces of the first and second dummies 351 and 352 are attached to the upper surfaces of the second adhesive member (not illustrated). The first adhesive member may be attached to the upper surfaces of the first and second dummies 351 and 352. The rear surface of the housing 310 may be attached to the upper surface of the first adhesive member (not illustrated). In this case, the key 320 may be exposed to the outside through the through-hole 311 of the housing 310 such that the key 220 may be pressed.

The first to third adhesive members may be formed to correspond to the shapes of the first and second dummies 351 and 352. For example, first to third adhesive members may be formed to face the first dummy 351, and other first to third adhesive members may be formed to face the second dummy 352. For example, as shown in FIG. 15A, third adhesive member portion 380a may have a same shape as first dummy 351 and third adhesive member portion 380b may have a same shape as second dummy 352.

In another embodiment, a water proofing structure for hermetically sealing an FPCB 390 may be formed on the second dummy 352.

The waterproofing structure may include other first to third adhesive members (for example, third adhesive member portion 382b) that are formed to correspond to the shape of the second dummy 352.

For example, the first adhesive member (not illustrated) that is formed in the shape of the second dummy 352 may be provided between the housing 310 and the dummy 350, the upper surface of the first adhesive member (not illustrated) may be attached to the rear surface of the housing 310, and the rear surface of the first adhesive member may be attached to the upper surface of the second dummy 352.

The second adhesive member (not illustrated) that is formed in the shape of the second dummy 352 may be provided between the second dummy 352 and the FPCB, the upper surface of the second adhesive member (not illustrated) may be attached to the rear surface of the second dummy 352, and the rear surface of the second adhesive member (not illustrated) may be attached to the upper surface of the FPCB.

The third adhesive member (for example, third adhesive member portion 380b) that is formed in the shape of the second dummy 352 may be provided between the FPCB and the structure 340. More specifically, the upper surface of the third adhesive member portion 380b may be attached to the rear surface of the FPCB, and the rear surface of the third adhesive member portion 380b may be attached to the upper surface of the structure 340.

The second and third adhesive members may have extension holes 392 formed therein through which the FPCB 390 passes such that the second and third adhesive members extend from the key 320 while being attached to the FPCB and establish an electrical connection with the electronic device 300. As described above, the first to third adhesive members may hermetically seal the FPCB 390.

According to various embodiments of the present disclosure, the dummy include first and second dummies, the first dummy may be coupled to a first step of the key, and the second dummy may be coupled to a second step that is opposite to the first step of the key.

An embodiment of a dummy 650 provided in an electronic device 600 having no waterproofing function (illustrated in FIG. 16) that includes a key, according to various embodiments of the present disclosure, will be described below.

Figure 16:
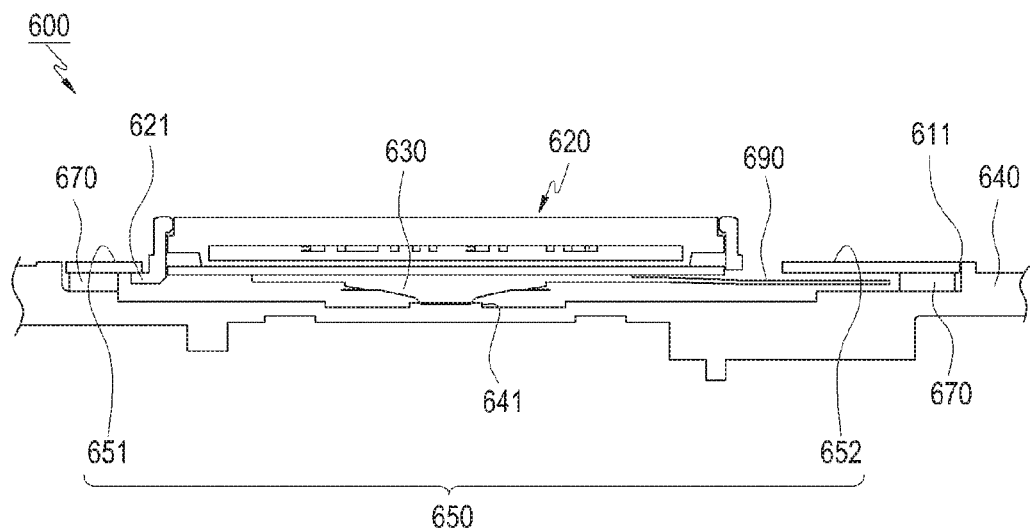
FIG. 16 is a side sectional view illustrating an embodiment of a dummy of a non-waterproof electronic device that includes a key, according to various embodiments of the present disclosure.

FIG. 16 is a plan view illustrating the embodiment of the dummy 650 provided in the electronic device 600 that includes the key, according to the various embodiments of the present disclosure, where a waterproofing structure is not applied to the electronic device 600.

Referring to FIG. 16, the electronic device may include a housing (not illustrated) that has a through-hole (not illustrated) formed therein, a key 620 having a key switch 630 mounted thereon, a structure 640, and a dummy 650. Since the housing (not illustrated), the key 620 having the key switch 630 mounted thereon, the structure 640, and a first adhesive member (not illustrated), and a second adhesive member 670 are the same as those illustrated in preceding FIGS. 4 and 12, detailed descriptions thereof will be omitted.

The dummy 650 may include first and second dummies 651 and 652. The first dummy 651 may be coupled to a first step of the key 620, and the second dummy 652 may be coupled to a second step that is opposite to the first step of the key 620.

For example, while the first and second dummies 651 and 652 are separated from each other, an insertion recess (not illustrated) of the first dummy 651 may be stopped by and coupled to a flange 621 that is formed on the first step of the key 620, and an insertion recess (not illustrated) of the second dummy 652 may be stopped by and coupled to a flange 621 that is formed on the second step of the key 620.

The first adhesive member (not illustrated) for attaching the first and second dummies 651 and 652 may be provided between the housing (not illustrated) and the upper surfaces of the first and second dummies 651 and 652, and the second adhesive member 670 for attaching the first and second dummies 651 and 652 to the structure 640 may be provided between the lower surfaces of the first and second dummies 651 and 652 and the structure 640.

More specifically, after the second adhesive member 670 is attached to the upper surface of the structure 640, the key 620 and the key switch 630 may be assembled to a mounting portion 641 of the structure 640, and the first and second dummies 651 and 652 may be attached to the upper surface of the second adhesive member 670. In this case, the insertion recesses (not illustrated) of the first and second dummies 651 and 652 may be stopped by the flange 621 of the key 620 to assemble the key 620 and the key switch 630. In this state, the first adhesive member (not illustrated) may be attached to the upper surfaces of the first and second dummies 651 and 652, and the rear surface of the housing (not illustrated) may be attached to the upper surface of the first adhesive member (not illustrated). In this case, the key 620 may be exposed to the outside through the through-hole 611 of the housing (not illustrated) such that the key 620 may be pressed.

The first and second adhesive members may be formed to correspond to the shapes of the first and second dummies 651 and 652. For example, first and second adhesive members may be formed to face the first dummy 651, and other first and second adhesive members may be formed to face the second dummy 652.

For example, the first adhesive member (not illustrated) that is formed in the shape of the first and second dummies 651 and 652 may be provided between the housing (not illustrated) and the first and second dummies 651 and 652, the upper surface of the first adhesive member (not illustrated) may be attached to the rear surface of the housing (not illustrated), and the rear surface of the first adhesive member may be attached to the upper surfaces of the first and second dummies 651 and 652.

The second adhesive member 670 formed in the shape of the first and second dummies 651 and 652 may be attached to the rear surfaces of the first and second dummies 651 and 652, and the rear surface of the second adhesive member 670 may be attached to the upper surface of the structure 640.

The key 620 may include an FPCB that extends from a part of the key 620 to electrically connect the key 620 and a printed circuit board (not illustrated) that is provided in the electronic device 600, and since the first and second adhesive members are not attached to the FPCB 690, a waterproofing function for the electronic device may not be implemented.

As described above, a third adhesive member is not additionally required when the first and second dummies 651 and 652 are applied to the electronic device 600 having no waterproofing structure applied thereto, so the first and second dummies 651 and 652 may be directly attached to the housing (not illustrated) and the structure 640 using only the first and second adhesive members. Accordingly, since a third adhesive member is not additionally needed in the various embodiments of the present disclosure, it is possible to reduce the number of components, thereby simplifying the assembly process as well as decreasing the manufacturing cost.

An embodiment of a dummy 450 provided in an electronic device 400 (illustrated in FIG. 17) that includes a key 420, according to various embodiments of the present disclosure, will be described below.

Figure 17:
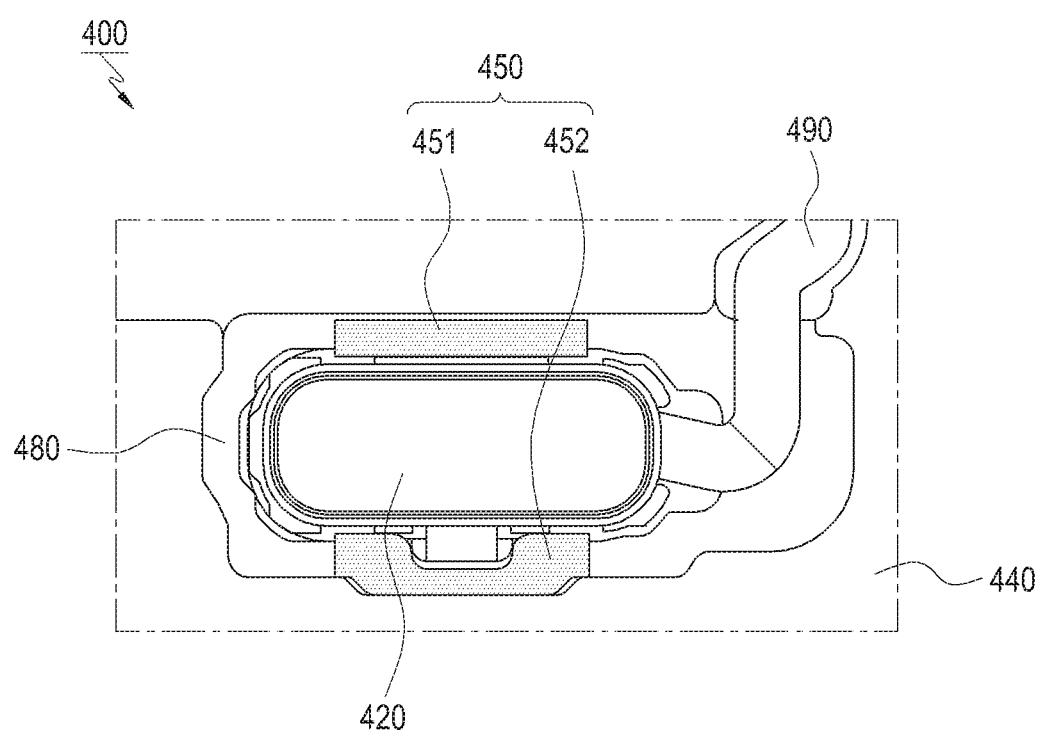
FIG. 17 is an isolated view illustrating an embodiment of a dummy. among elements of an electronic device that includes a key, according to various embodiments of the present disclosure.

FIG. 17 is a plan view illustrating the embodiment of the dummy 450 among elements of the electronic device 400 that includes the key 420 according to the various embodiments of the present disclosure.

Referring to FIG. 17, the electronic device 400 may include a housing (not illustrated) having a through-hole (not illustrated) that is formed therein, the key 420 having a key switch (not illustrated) that is mounted thereon, a structure 440, and the dummy 450. Since the housing, the key 420 having the key switch (not illustrated) mounted thereon, the structure 440, and first to third adhesive members are the same as those illustrated in preceding FIGS. 4 and 12, detailed descriptions thereof will be omitted.

The dummy 450 may include first and second dummies 451 and 452. The first dummy 451 may be coupled to a first step on a side surface of the central portion of the key 420, and the second dummy 452 may be coupled to a second step on a side surface of the central portion of the key 420, which is opposite to the first step of the key 420.

For example, while the first and second dummies 451 and 452 are vertically separated from each other with respect to the key 420, one surface of the first dummy 451 may be stopped by and coupled to a flange (not illustrated) that is formed on a side surface of the central portion of the first step of the key 420, and one surface of the second dummy 452 may be stopped by and coupled to a flange (not illustrated) that is formed on a side surface of the central portion of the second step of the key 420.

The first adhesive member (not illustrated) for attaching the first and second dummies 451 and 452 may be provided between the housing (not illustrated) and the upper surfaces of the first and second dummies 451 and 452, and the second and third adhesive members for attaching the first and second dummies 451 and 452 to the structure 440 may be provided between the lower surfaces of the first and second dummies 451 and 452 and the structure 440. For example, the third adhesive member 480 may be attached to the upper surface of the structure 440, and the second adhesive member (not illustrated) may be attached to the upper surface of the third adhesive member 480. The key 420 and the key switch (not illustrated) may be assembled to a mounting portion (not illustrated) of the structure 440, and one surface of each of the first and second dummies 451 and 452 may be stopped by the flange (not illustrated) of the key 420 to assemble the key 420 and the key switch at the same time that the rear surfaces of the first and second dummies 451 and 452 are attached to the upper surface of the second adhesive member (not illustrated). The first adhesive member may be attached to the upper surfaces of the first and second dummies 451 and 452, and the rear surface of the housing (not illustrated) may be attached to the upper surface of the first adhesive member (not illustrated). In this case, the key 420 may be exposed to the outside through the through-hole (not illustrated) of the housing (not illustrated) such that the key 420 may be pressed.

The first to third adhesive members may be formed to correspond to the shapes of the first and second dummies 451 and 452. For example, first to third adhesive members may be formed to face the first dummy 451, and other first to third adhesive members may be formed to face the second dummy 452.

As illustrated in FIG. 17, a waterproofing structure for hermetically sealing the FPCB 490 extending from the key 420 is not applied to the first to third adhesive members. For example, the first to third adhesive members are attached to the upper and lower portions of the side surfaces of the central portion of the key 420, but are not attached to the FPCB 490. Accordingly, the first and second dummies 451 and 452 may not be applied to a waterproof phone.

According to various embodiments of the present disclosure, the dummy may include first and second dummies, the first dummy may be coupled to a first step on a side surface of the central portion of the key, and the second dummy may be coupled to a second step on a side surface of the central portion of the key, which is opposite to the first step of the key.

An embodiment of a dummy provided in an electronic device 500 that includes a key, according to various embodiments of the present disclosure, will be described below.

Figure 18A:
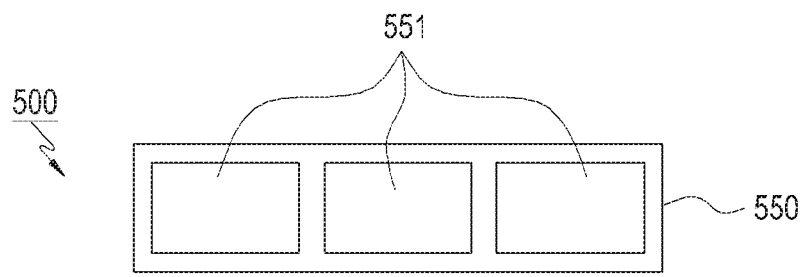
FIGS. 18A to 18C are isolated views illustrating an embodiment of a dummy, among elements of an electronic device that includes a key, according to various embodiments of the present disclosure.
Figure 18B:
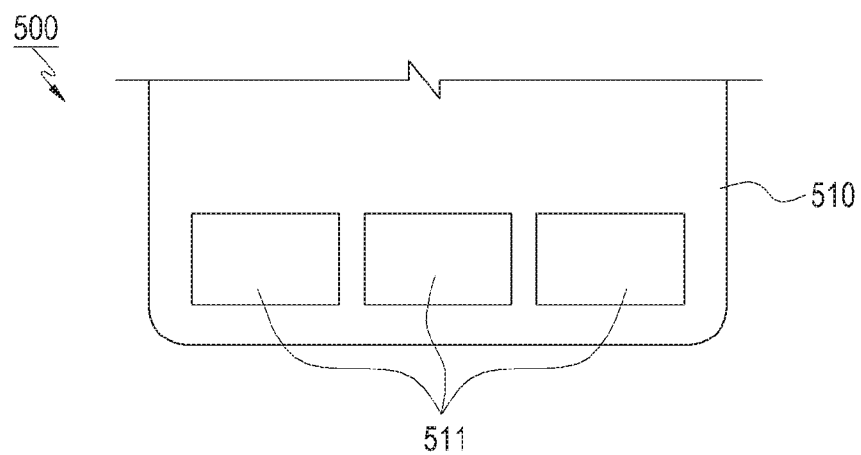
Figure 18C:
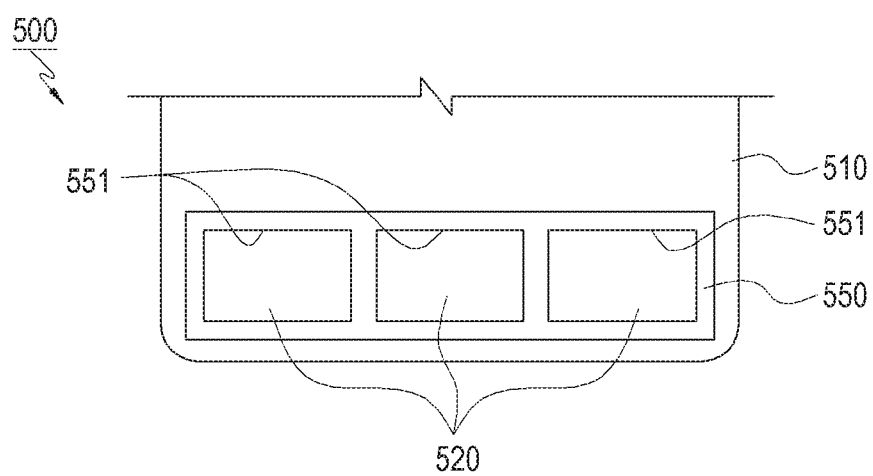

FIGS. 18A to 18C are plan views illustrating the embodiment of the dummy 550 among elements of the electronic device 500 that includes keys 520 according to the various embodiments of the present disclosure.

Referring to FIGS. 18A to 18C, the electronic device 500 may include a housing 510 having through-holes 511 formed therein, the keys 520 having key switches (not illustrated) that are mounted thereon, a structure (not illustrated), and the dummy 550. Since the housing 510, the keys 520 having the key switches (not illustrated) that are mounted thereon, the structure (not illustrated), and first to third adhesive members are the same as those illustrated in preceding FIGS. 4 and 12, detailed descriptions thereof will be omitted.

As illustrated in FIGS. 18A to 18C, the dummy 550 may have at least one opening 551 formed therein so as to be coupled with the entire outer periphery of the keys 520. For example, three keys 520 may be disposed on the structure (not illustrated), and the dummy 550 may be coupled to the three keys 520. Three openings 551 may be formed in the dummy 550 so as to be coupled with the three keys 520 so that the three openings 551 may be mounted on the three keys 520. Further, the housing 510 having three through-holes 511 formed therein may be coupled to the upper portion of the dummy 550. The three keys 520 may be exposed through the three through-holes 511 and may be coupled to the three through-holes 511 such that the three keys 520 may be pressed.

In another embodiment, three keys 520 or more, or three keys 520 or less, may be disposed on the structure (not illustrated).

In yet another embodiment, the dummy 550 may have the first to third adhesive members (not illustrated) mounted on the housing 510 and the structure (not illustrated). The first to third adhesive members (not illustrated) may have three adhesive openings (not illustrated) that are formed therein to correspond to the three openings 551 of the dummy 550.

According to various embodiments of the present disclosure, the dummy may be constituted by a dummy having at least one opening formed therein which is coupled with the entire outer periphery of the key.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device including a key, comprising:
a housing covering at least a portion of a front of an electronic device and having a lower portion that includes a through-hole formed therein;
a structure provided on a back side of the electronic device, wherein the structure comprises a lower part corresponding to the lower portion of the housing;
a key having a front surface at least partially exposed through the through-hole and a rear surface facing opposite the front surface, wherein the key is configured to be pressed by a user in a direction toward the structure;
a key switch located between the rear surface of the key and the structure, wherein the key switch is configured to enable the key to be pressed;
a dummy detachably provided between the housing and the structure, wherein the dummy, when attached, supports the key and the key switch such that the key and the key switch are capable of being pressed in the through-hole toward the direction of the structure;
a flange protruded from an outer periphery of the key; and
at least one or more adhesive members are provided between the lower surface of the dummy and the structure,
wherein the dummy, when attached, be stacked on the one or more adhesive members, and
wherein the dummy is provided on an upper surface of at least part of the flange.

2. The electronic device of claim 1, wherein the key switch comprises a reverse dome shape having a wider, bottom portion of a dome on the rear surface of the key protruding therefrom to a top, narrower portion of the dome closer to the structure than the bottom portion of the dome.

3. The electronic device of claim 1, wherein the structure comprises a mounting portion configured to mount an end of the key switch thereto.

4. The electronic device of claim 1, wherein a first adhesive member is provided between the housing and an upper surface of the dummy, and second and third adhesive members are provided between the lower surface of the dummy and the structure.

5. The electronic device of claim 4, further comprising a flexible printed circuit board (FPCB) that is coupled to the key through the second and third adhesive members, and extends from a part of the key to form a waterproofing structure using the second and third adhesive members.

6. The electronic device of claim 5, wherein the waterproofing structure comprises:
the second adhesive member provided between the dummy and the FPCB; and
the third adhesive member provided between the FPCB and the structure,
wherein the second and third adhesive members comprise extension holes through which the FPCB passes while the second and third adhesive members are attached to the FPCB.

7. The electronic device of claim 6, wherein the first to third adhesive members comprise a double-sided tape or an adhesive.

8. The electronic device of claim 6, wherein the dummy comprises a flange portion attached thereto that can be separated from the remaining portion of the dummy.

9. The electronic device of claim 5, wherein one of a second key, a key button, a fingerprint sensor, a connector, a printed circuit board (PCB), a detection sensor, an optical sensor, a temperature sensor, a vein sensor, and a human-body detection sensor is provided on opposite ends of the FPCB.

10. The electronic device of claim 1, wherein the housing comprises a window, and the structure comprises a front case and a bracket.

11. The electronic device of claim 1, wherein the key and the key switch are fixed by the housing such that the key and the key switch are not separated from the through-hole even though the dummy is attached or detached.

12. The electronic device of claim 1, wherein the dummy comprises a first dummy and a second dummy, the first dummy being coupled to a first step of the key and the second dummy being coupled to a second step that is opposite to the first step of the key.

13. The electronic device of claim 1, wherein the dummy comprises a first dummy and a second dummy, wherein the first dummy is coupled to a first step on a side surface of a central portion of the key, and the second dummy is coupled to a second step on a side surface of the central portion of the key, which is opposite to the first step of the key.

14. The electronic device of claim 1, wherein the dummy comprises a dummy having at least one opening formed therein which is coupled with the entire outer periphery of the key.

15. The electronic device of claim 1, wherein the dummy separates the key and the key switch from the through-hole when detached.

* * * * *